United States Patent [19]
Canning

[11] 3,992,686
[45] Nov. 16, 1976

[54] BACKPLANE TRANSMISSION LINE SYSTEM

[75] Inventor: Tim W. Canning, Berkeley, Calif.

[73] Assignee: The Singer Company, Elizabeth, N.J.

[22] Filed: July 24, 1975

[21] Appl. No.: 598,592

[52] U.S. Cl. .................... 333/84 M; 317/101 CM; 317/101 DH; 333/12
[51] Int. Cl.² ...................... H01P 3/08; H02B 1/04
[58] Field of Search ............... 333/84 R, 84 M, 6, 8, 333/9, 12; 317/101 CB, 101 CE, 101 CM, 101 D, 101 DH

[56] References Cited
UNITED STATES PATENTS

| | | | |
|---|---|---|---|
| 3,300,686 | 1/1967 | Johnson et al. ............... | 317/101 DH |
| 3,404,387 | 10/1968 | Amemiya ............................ | 333/8 X |
| 3,519,959 | 7/1970 | Bewley et al. .................. | 333/84 R X |
| 3,657,701 | 4/1972 | Garth ........................ | 317/101 CM X |

Primary Examiner—Paul L. Gensler
Attorney, Agent, or Firm—Edward L. Bell; Robert E. Smith; Julian Falk

[57] ABSTRACT

A backplane motherboard which mounts a plurality of printed circuit boards and which provides microstrip transmission lines to interconnect the components of an inserted PC board with any of the other inserted PC boards. All transmission lines are terminated at both ends with the characteristic impedance, and the plane of the motherboard is made of a sandwich construction having a ground plane, a Mylar insulating plane, a voltage plane, and outer epoxy surface insulators. The plane sandwich also carries terminal pins for holding additional printed circuit boards.

21 Claims, 13 Drawing Figures

Fig. 8
TYPICAL BUFFER WITH OPEN COLLECTOR OUTPUT

Fig. 9
BUFFER WITH TRI-STATE OUTPUT

FIG. IIb

FIG. IIa

BACKPLANE TRANSMISSION LINE SYSTEM

BACKPLANE: PRIOR ART

This invention relates to interconnection and transmission line assemblies which are useful for the handling of high-speed digital switching networks such as those used in digital computers.

Today, digital computer equipment is generally built of hundreds of components which are mounted on printed circuit boards. These printed circuit boards are aggregated and mounted in juxtaposition to each other and generally connected to groups of female connectors mounted on what may be called a backplane or motherboard. In this situation, it is necessary that the many hundreds of components have the capability of being connected to each other, and other components along interconnecting lines, which even though relatively short, actually become transmission lines due to the high frequencies generated by the rapid rise and fall times of the digital pulses.

The problem arises of how to efficiently and compactly interconnect these many hundreds, or even thousands, of components so that digital signals may be both sent and received between these components on interconnecting lines in a manner in which there is no signal degradation, signal alteration, cross talk, ringing, or other undesirable influences which would change or degrade the quality of the pulses. In the present state of the art, logic circuitry has been developed which operates upon digital signals, which have rise times and fall times of the order of $10^{-9}$ seconds, that is to say, "nanosecond" time factors.

These types of circuits increase the maximum possible operating speeds of the digital switching networks so that the signal delay times of the transmission lines or circuit conductor lines become important factors determining the possible network operating speed.

Thus, the problems arise in (a) trying not to impede the high operating speeds of the logic circuitry by limitations which might occur by virtue of the connecting transmission lines, and (b) in preventing logic errors which could occur from distortion of signals.

Since the assembly and circuit networks are very close and compact, care must be taken that the coupling between different lines do not lead to unwanted interference and that the characteristics of the various connecting or transmission lines do not vary, as between each other, in their transmission characteristics and characteristic impedances.

Further, any cross-coupling or oscillatory or ringing action must not occur or must be reduced to within acceptable limits.

In the prior art, the connecting or transmission lines were often accomplished by etched lines on the backplane which were arranged in a random fashion. Later, patterned lines were made in an attempt to equalize the characteristics of the transmission lines so that each of the lines would present a uniform and controlled impedance to the signals. Further, various attempts were made to fix the interconnecting or transmission lines so that they would present a given characteristic impedance.

For instance, various methods have been used to build the transmission lines such as a "zig" line on one side of the backplane and a "zag" line on the other side of the backplane to bring about the effect of the twisted lead condition often used to reduce magnetic interference from adjacent circuits.

Other prior art systems have made transmission lines to consist of triple strip lines composed of three lines disposed parallel to one another and the center line being connected at its input point to a source of reference potential and the two outer being connected to carry information signals, with the outer lines being connected at their outputs in opposition to the center line, the terminal resistances having the same resistance value.

The present invention provides for bus type transmission lines in which both ends, not just one end, are terminated in the characteristic impedance which is substantially lower than the input resistances of the circuits connected thereto, so that the circuits will have little loading effect.

The present invention involves a plurality of microstrip transmission lines on a backplane wherein each end of a two-ended transmission line is terminated with its characteristic impedance and the transmission line is composed of a single etched copper strip operating with a common ground plane which provides the low side of the transmission line.

Further, a support assembly is provided wherein a backplane motherboard, having a plurality of female connectors to receive printed circuit boards, is so organized and connected as to provide transmission lines so that each respective terminal pin on each female connector is connected to the same respective terminal pin number on each and every other female connector; and there is provided a removable printed circuit board (terminator board) which is connected to the backplane and which provides the appropriate impedance networks to match the characteristic impedance at both ends of each transmission line. These terminating impedances generally consist of a capacitor and resistor combination.

Another problem involved in these types of system assemblies is that in Transistor-Transistor Logic, buffers of two varieties are used. These are the "open collector" type buffer and the "tri-state" buffer. Each type of buffer operates in a particular fashion and have their current and voltage limitations, which renders problems in providing the appropriate terminating impedances. These problems with the use of Transistor-Transistor Logic have been resolved by the particular terminating networks described in this particular system.

This invention relates to complex backpanel wiring, especially to multiple layer structural elements for accomplishing such wiring and especially for computer modular assemblies. Computers often are built on racks which slideably receive a large number of interchangeable printed circuit boards which connect to a "backplane motherboard".

Reliable connections are required between the printed or etched lines from PC (printed circuit) boards to other PC boards. These are obtained by means of pins which are pushed through a line of holes in the backplane to connect the terminals of different PC boards to each other via microstrip transmission lines on the backplane.

There are many problems involved in the wiring of multiple cross connections; the prior art often used either hand wiring or computer-directed wrap-wiring around the terminal pins which extended out through the back face of the backplane. This was often a tedious and expensive proposition. Problems of shielding the lines and the prevention of cross-talk and noise occurred.

Another problem with the use of backplanes was the delivery of power along highly conductive power bus lines which could provide a variety of voltages and currents to different areas of the backplane. In the present invention, the power is provided by an inner voltage plane consisting of a series of strips carrying various voltages required by the logic circuitry. Only those specific pins (for conveying specific voltage levels to the printed circuit board) are actually connected to the specific parts of the voltage plane.

SUMMARY OF THE INVENTION

The present invention involves the system by which transmission lines are provided for interconnecting a variety of electronic devices and components (including power supplies) and whereby a plurality of printed circuit boards may be mounted in a compact space, and be connected by microstrip lines on a backplane motherboard so that each terminal pin of the PC board may be connected respectively to the corresponding terminal pin of every other printed circuit board. Further, this is done through an etched microstrip line in combination with a ground plane which forms a series of transmission lines so constituted as to diminish spurious signals such as ringing, and cross-talk, and which also operate to prevent signal degradation, change in rise or fall time, or distortion of the signal waveform.

In complex electronic or computer systems, many components are mounted together in small compact closely knit areas. These items include: gates, buffers, processor circuitry, logic circuitry, memories, control logic, etc. Often the components consist of gating devices which may be designated as TTL or Transistor-Transistor Logic.

One primary objective of the overall system is to permit the transmission of a signal from a buffer on one PC board over to a device on another PC board. To do this requires that the source gates provide a transition signal by which the source buffer will either lower an existing voltage or raise an existing voltage on a particular line or terminal.

In circuits and transmission lines, having high rates of change (where the rise time or the fall time of the signal may be on the order of 1 to 10 nanoseconds), the system transmits these transition signals accurately without slowing up the rise and fall times or changing the slope characteristic of any of the features of the signal.

The system of a backplane motherboard with dually terminated transmission lines described here handles the problems involved in interconnecting hundreds of components which operate on signals having 1 to 10 nanosecond rise times without significant distortion or other transmission errors.

BRIEF DESCRIPTION OF THE DRAWINGS

FIGS. 10a and 11a show oscillograph photographs of signal characteristics on a prior art backplane while

DESCRIPTION OF THE PREFERRED EMBODIMENT

Figure 1:
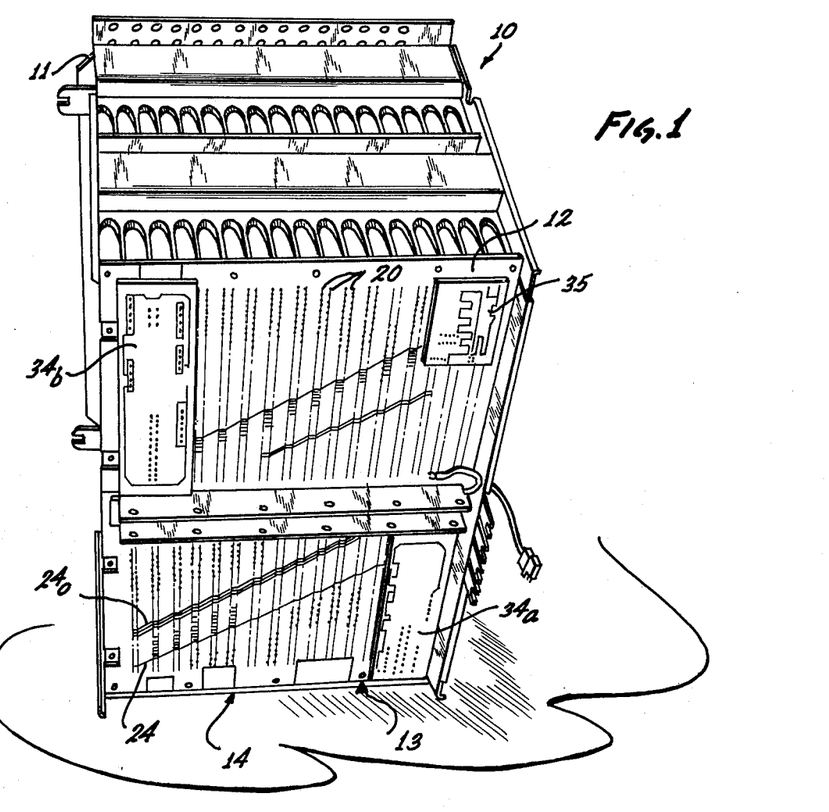
FIG. 1 is a view in perspective of the backplane motherboard mounted on a support frame and showing the outer side of the motherboard.

In FIG. 1 there is seen a backplane assembly unit 10 mounted on a frame support 11 and wherein the backplane motherboard is indicated as element 12, having an inside face 14 and an outside face 13.

Feed-through terminal pins 20 are mounted so as to connect the inside face of the motherboard to the outside face and connect to internal voltage and ground planes.

The backplane motherboard also supports two terminating network printed circuit boards 34a and 34b. It may also support other printed circuit boards as for example, the clock circuitry 35.

The backplane motherboard 12 is arranged in this embodiment so that a series of terminal pins 20 are organized into rows and columns into separate areas. For example, the lower half of the motherboard may be organized with 16 columns of double-sets of terminal pins. Likewise, the upper half side of the motherboard may be similarly organized.

Microstrip transmission lines 24 are etched on the backplane in order to connect specified terminal pins on one column to similarly placed terminals on each and every one of the other columns involved. Thus, the microstrip lines on the outside of the motherboard may be designated 24o (FIG. 1) and the other microwire lines on the inside of the board may be designated 24i (FIG. 2).

Figure 2:
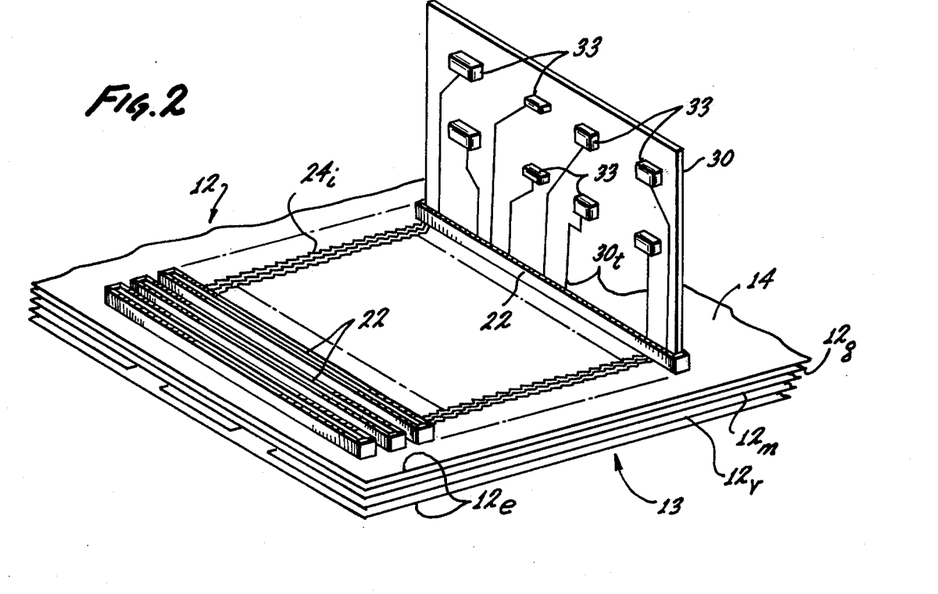
FIG. 2 is a diagrammatic sketch showing a section of the backplane motherboard and indicating the inner face mounting the female connectors which hold printed circuit boards; also indicated is the layer-sandwich structure of the motherboard.

Referring to FIG. 2, a section of the backplane motherboard 12 is shown in indicating the mounting of the female connectors 22 and the sandwiched construction layers which go to make up the backplane of the motherboard.

A series of female connectors 22 are mounted on the inside face 14 of the motherboard 12 in order to provide electrical connections to the traces 30t on printed circuit board 30. The printed circuit board 30 may have mounted on it various active (transmitting) and passive (receiving) elements such as indicated at 33. These elements connect from the PC board to the female connector 22 from whence they are interconnected to other printed circuit boards and elements via microstrip interconnection line 24i.

As seen in FIG. 2, the planar portion of the motherboard is made of two outer glass epoxy insulators 12e between which are sandwiched a ground plane 12g and a voltage plane 12v, the ground plane and voltage plane being separated by an insulating layer 12m.

Figure 3:
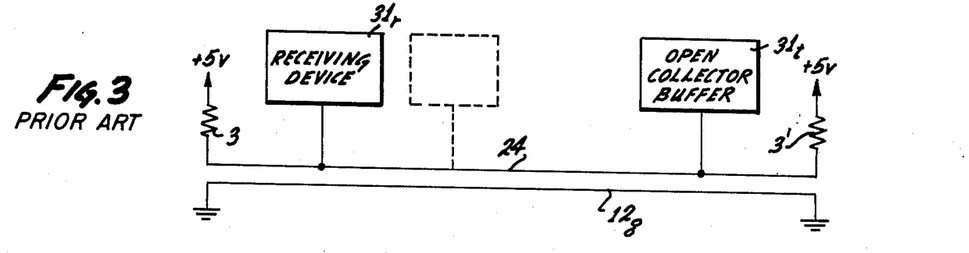
FIG. 3 is a schematic of a transmission line connecting open collector buffer devices often found on a motherboard and its printed circuit boards, and shows prior attempts to terminate the transmission line.
Figure 4:
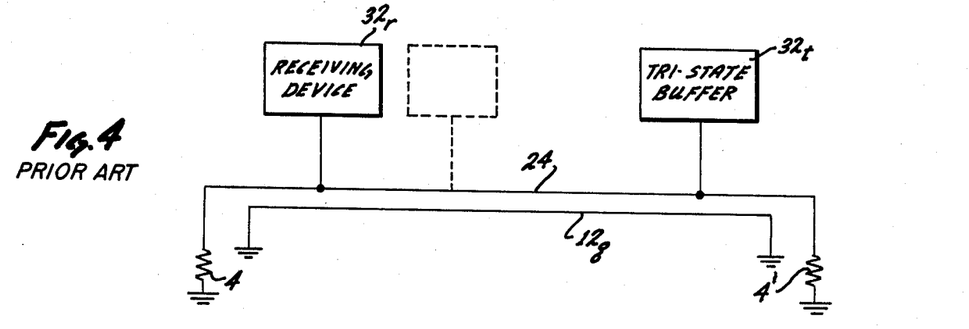
FIG. 4 is a schematic of another prior attempt to terminate transmission lines in situations using a tri-state buffer.
Figure 5:
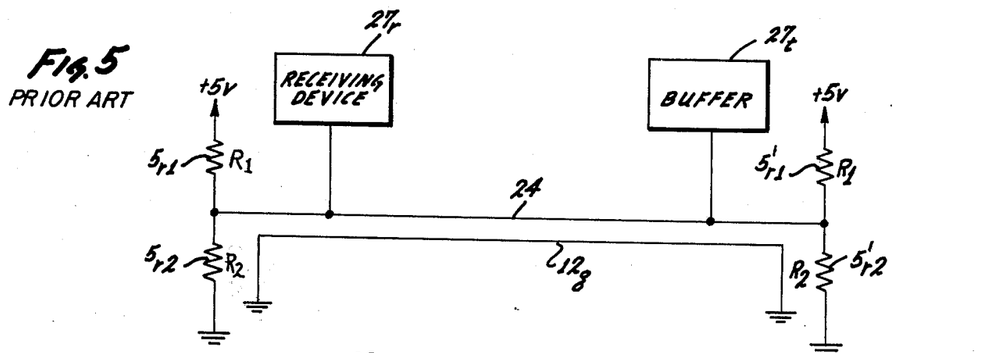
FIG. 5 is a schematic of another prior scheme to terminate transmission lines between sending and receiving devices.

FIGS. 3, 4 and 5 show schematic drawings of attempts made to terminate transmission lines using printed circuit devices with the attempt to provide uniform characteristic impedance with optimum transmission of signals.

In FIG. 3 is shown the interconnection between the open collector buffer device 31t and a receiving device 31r connected by the transmission line 24 and ground plane 12g. In this situation, resistors 3 and 3' (of 100 ohms) are used as terminating devices on the transmission line (of characteristic impedance $Z_o = 100$ ohms) and between the 5 volt power supply source.

In FIG. 4 the transmission line 24 and ground plane 12g interconnect a tri-state buffer 32t to a receiving device 32r, and resistors 4 and 4' (of 100 ohms each) are used to terminate the transmission line in its characteristic impedance, $Z_o$, which is 100 ohms.

In FIG. 5, a transmitting device 27t such as a buffer is connected to a receiving device 27r through transmission line 24 and ground plane 12g. Terminations are made at each end using resistors $5r_1$ and $5'r_1$ (167 ohms) and $5r_2$ and $5'r_2$ (250 ohms) to match the characteristic impedance of the transmission line, such that $Z_o = 100$ ohms.

Figure 6:
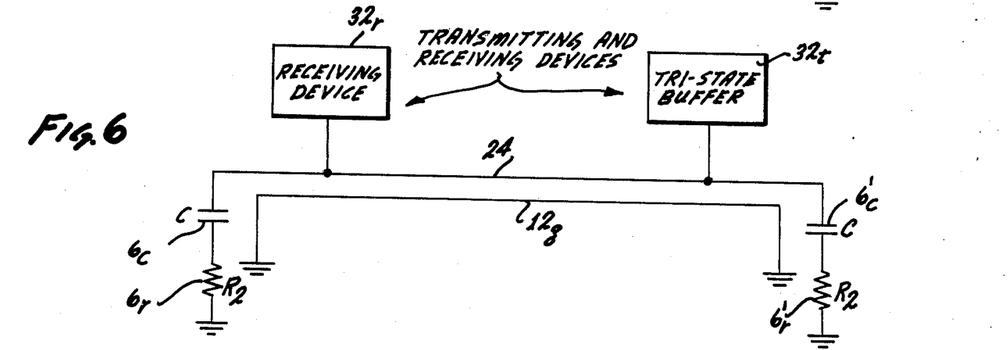
FIG. 6 is a schematic of the system used in the present invention for terminating transmission lines working in conjunction with transmitting and receiving devices, especially in the case where a tri-state buffer is being utilized.

FIG. 6 shows a portion of the embodiment of the present invention wherein a "tri-state" buffer device 32t is connected to a receiving device 32r by means of transmission line 24 and ground plane 12g. Capacitors 6c and 6'c of 150 micromicrofarads and resistors 6r and 6'r (of 100 ohms) are used for termination at both ends of the transmission line.

Figure 7:
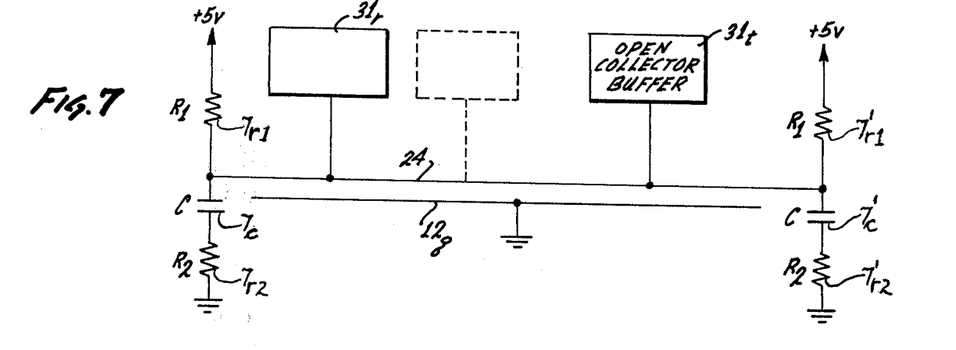
FIG. 7 is a schematic of a terminated transmission line used in the present invention in the situation when buffers of the open collector type are used.

In FIG. 7 a further embodiment of the present invention shows an "open collector" buffer 31t connected to a receiving device 31r by means of transmission line 24 and ground plane 12g. Both ends of the transmission line are terminated with resistors 7r1, 7r2 and 7'r1, 7'r2 (of the value of $R_1$ and $R_2$) and capacitors 7c and 7'c (of 150 micromicrofarads each) such that $Z_o = (R_1 R_2)/R_1+R_2$ FIG. 8 shows a typical buffer with open collector outputs such as is used in Transistor-Transistor Logic in many types of computer circuitry.

Figure 8:
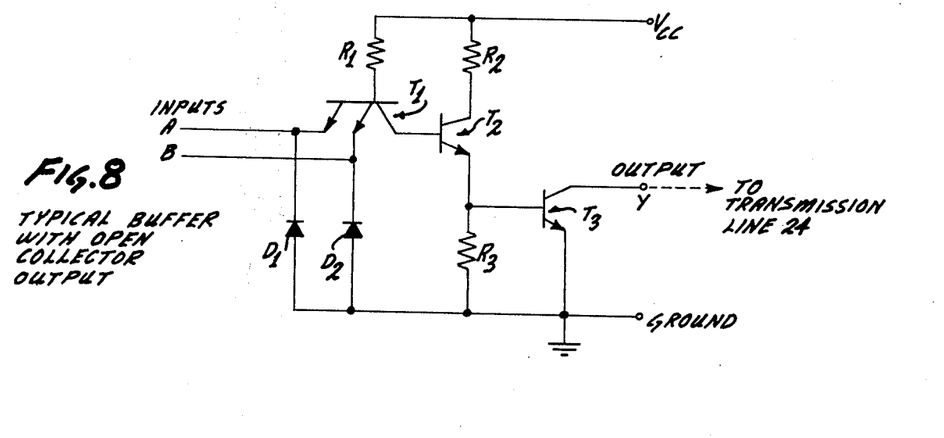
FIG. 8 is a circuit diagram of a typical commercial buffer with open collector output.

The Open Collector Buffer, shown in FIG. 8, is described at Page 107 of the Texas Instruments Manual, entitled "The TTL Data Book for Design Engineers", First Edition and copyrighted 1973. This buffer has inputs A and B, two diodes D1 and D2, three transistors, $T_1$, $T_2$ and $T_3$ interconnecting with resistors $R_1$, $R_2$ and $R_3$. The output Y is the collector of transistors $T_3$ and feeds to the transmission line 24. The voltage supply $V_{cc}$ is the collector supply voltage and is typically set at 5 volts.

Figure 9:
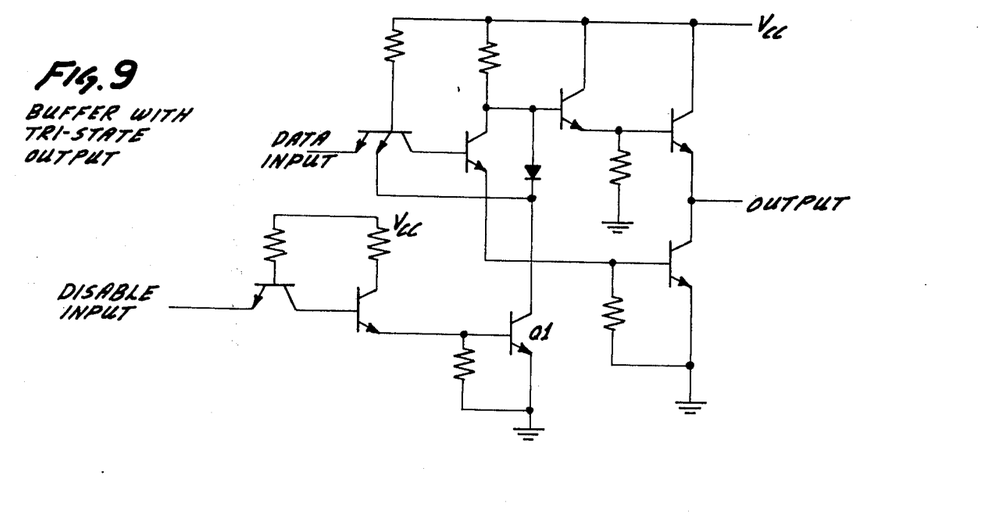
FIG. 9 is a circuit diagram of a commercial buffer with tri-state output.

In FIG. 9 is seen a commercially available buffer with tri-state output. This typical gate is used in Transistor-Transistor Logic and is described in National Semiconductor Corporation application note AN-45 dated July, 1971.

The signal lines of the multi-layer backplane are microstrip transmission lines formed by etched traces over a ground plane or over a voltage plane depending on whether the traces are on the inside face 14 or the outside face 13 of the board. The microstrip lines on the boards are of approximately 100 ohms characteristic impedance and are intended to be driven by either "open collector" or "tri-state" Transistor-Transistor Logic buffers.

Since it is not known at what point on the signal line the particular buffer driving the line will be, it is necessary to terminate the line at both ends in order to avoid ringing of the signals after a signal transition from one state to another. In general the high-to-low transitions are the most troublesome.

To prevent reflections of energy from the open ends of the lines and thereby prevent ringing, a resistance equal to the characteristic impedance of the signal line is placed at both ends of the line. The other end of this resistance can go either to plus 5 volts or to ground since both ends act as the same point with respect to AC currents. Thus, given a typical transmission line on the backplane which connects to a large number of other terminals which go to various elements on separate printed circuit boards, the situation occurs where an electronic control device on one of the printed circuit boards is used to regulate the voltage and signal condition of a given transmission line of the backplane.

The type of control device which is called "an open collector" has the sole function of only pulling the existing voltage of the line down to "zero".

Another type of control device called a "tri-state buffer" serves a little more complex control function. The tri-state device can pull down the voltage of the transmission line to "zero"; or it can push up the transmission line to logical 1 (which is generally the high voltage signal) or it can just be a high impedance line without any affect on the line voltage.

Generally, the problem which arises in the use of Transistor-Transistor Logic circuitry and buffers in a complex interconnected system, is that there are limitations on the sink and the source capacities of the buffers which make it difficult to drive the transmission line signal in the proper fashion.

Looking at the transmission line of FIG. 3 and the terminations thereof, the terminations are ideal from an AC standpoint, but from a DC standpoint, the situation requires that the device 31t controlling the signal line would have to sink 92 milliamperes in order to get the line voltage down to 0.4 volts. Most buffers are not capable of sinking this amount of current.

Likewise, the termination scheme shown in FIG. 4 may also be ideal from an AC standpoint but leads to problems from a DC standpoint. In FIG. 4 the buffer (tri-state) control device 32t is required to source 48 milliamperes in order to reach or bring about a voltage of 2.4 volts on the transmission line. Since the tri-state buffers can only source about 5 milliamperes, this would render the tri-state buffers inadequate for the purpose; and since the open collector buffers cannot source current, the open collector buffer would require external pull-up resistors to plus 5 volts to reach a logical 1.

The termination scheme shown in FIG. 5 is again adequate AC wise. The control device 27t must sink 52 milliamperes of current in order to reach a logic 0 or low. However, this exceeds the capacity of the tri-state and open collector buffers.

On looking over these problems it would be seen that it is only required that the characteristic impedance (100 ohms) terminating resistor be present during voltage changes on the transmission line.

In FIG. 6, if the rise time $t_r$ of the signal is less than $R_2C$, (100 ohms times the capacity in farads), then the $R_2C$ value will generally exceed 100 nanoseconds; and the 100 ohms resistor, $6_r$, will behave as if it were connected directly, since the voltage across the capacitor $6_c$ will change slowly compared to the signal. Direct current-wise, the signal line can be sustained at any voltage level without sinking or sourcing any current whatsoever. Thus, the tri-state buffer $32_t$ in FIG. 6 will serve exceedingly well since there is no requirement for sinking or sourcing any current.

Now in regard to the open collector buffer control gate $31t$, the open collector requires a pull-up resistor $R_1$ which can then be inserted as shown in FIG. 7. Thus, the open collector buffer $31_t$ can control signals on line 24 and on which signals may be adequately received by any connected receiving device such as $32_r$; and the transmission line 24 is seen terminated by resistors $R_1$ and $R_2$ and a capacitor $7_c$ (or C) at both ends of the transmission line.

In FIG. 7, the total termination resistance, $R_t$, would be equal to the product of $R_1$, $R_2$ divided by the sum of $R_1 + R_2$, that is: $R_t = (R_1 \cdot R_2/R_1 + R_2 = 100$ ohms. Thus, the total termination resistance would be made equal to 100 ohms, which matches the characteristic impedance of the signal line.

Now, if the rise time $t_r$ is smaller than the product of $R_2C$, it will be seen that the rise time and the fall time of the transitions of the signal on the transmission line will not be deteriorated and will present a clean cut transition signal.

An earlier predecessor backplane, familiar to the inventor, had been built of two separate motherboards connected by a "turnaround" board. This earlier embodiment had no terminating impedances on the ends of the etched microstrip lines, and the backplane did not have a voltage plane. This earlier version of a motherboard backplane operated at bit rates in the 5 megahertz range, also using pulses having rise times and fall times of from 1 to 10 nanoseconds.

This earlier embodiment of a backplane was tested with an oscillograph in order to view the signal characteristics on the transmission lines and also to see what problems, signal alterations, and/or ringing might occur on these transmission lines as the result of a signal transition.

In the present embodiment as described in this application, the backplane motherboard forms a distributed capacitance between the voltage plane and the ground plane. Further, it provides terminating impedances at both ends of each transmission line. In the present embodiment of the backplane transmission line system, the microstrip lines have a width of only 15 mils and a center-to-center separation between adjacent lines of 100 mils. The earlier backplane system had microstrip lines having a width of 60 mils and a center-to-center separation of 100 mils. Thus, the present embodiment of the backplane transmission line system has microstrips of a much small width. The microstrip transmission lines of the old backplane system had an impedance of 63 ohms and were not terminated; however, the transmission lines of the present backplane system are set up for a 100 ohms characteristic impedance and the lines are terminated at both ends with 100 ohms for matching purposes.

FIGS. $10_a$ and $10_b$, $11_a$ and $11_b$ show oscillographic tests involving the signal transmission characteristics typical of the earlier backplane motherboard and the present embodiment involving the new backplane transmission line system. In each of these cases, the pattern of FIGS. $10_a$ and $11_a$ shows the transmission line signals of the earlier version, while the FIGS. $10_b$ and $11_b$ represent the present improved version of this embodiment showing the signal waveforms involved.

Figure 10A:
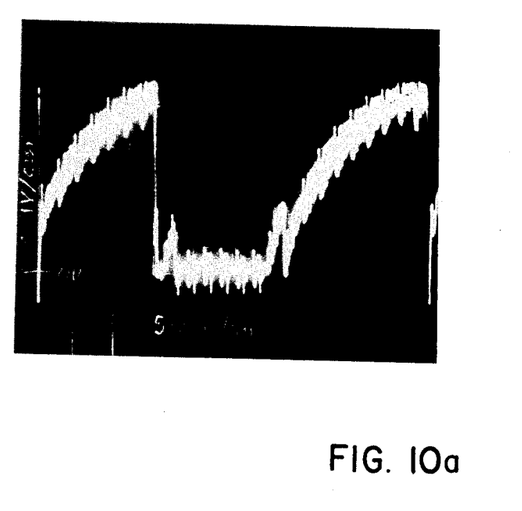
Figure 10B:
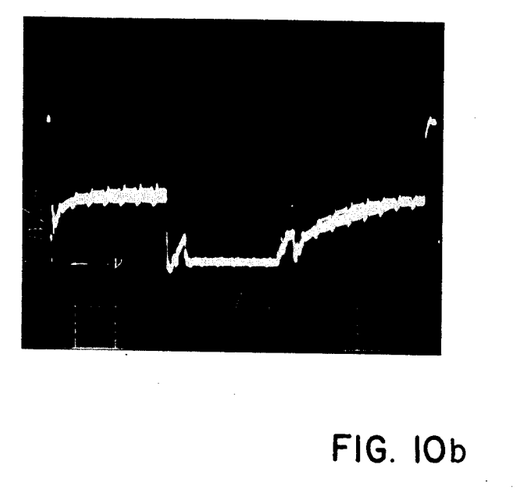
FIGS. 10b and 11b show the improved signal character of the presently developed backplane.

In FIGS. $10_a$ and $10_b$ the oscillographs show digital signal transition pulses along a base of 500 nanoseconds/centimeter having an ordinate of 1 volt per centimeter. Here, viewing the amount of crosstalk, it is seen that the old transmission system of FIG. $10_a$ has considerably greater roughness and hash on it compared to the lower crosstalk and smoother characteristics of the present system in FIG. $10_b$. The meaningful portion of these curve traces is the negative pulse area which resides between 3 to 6 centimeters from the left side of the photographic grid.

Figure 11A:
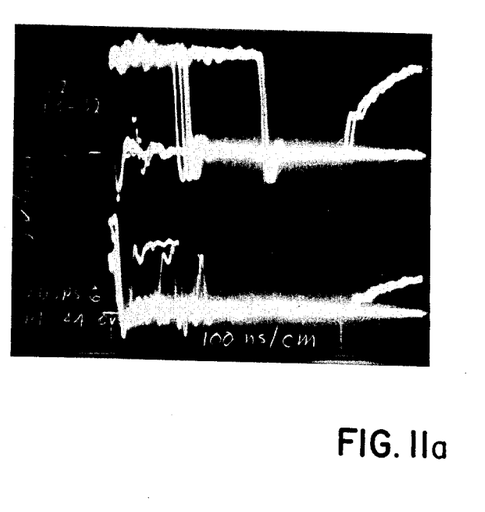
Figure 11B:
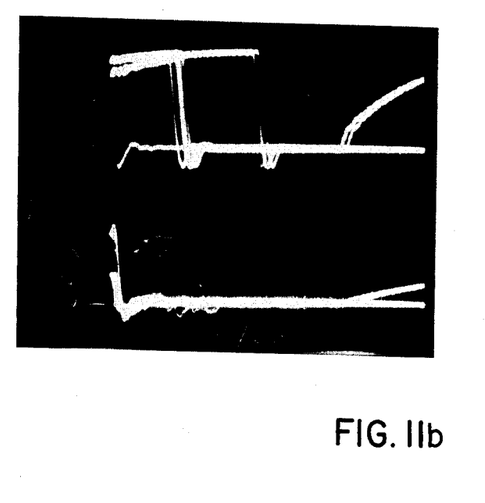

In the older version of the backplane transmission line system, FIG. $11_a$ shows considerable cross-talk and ringing on the signal shown in the upper half of the photograph. The lower portion of the same photograph, FIG. $11_a$, is the concurrent signal on the address line. In the new backplane transmission line system, there is seen in FIG. $11_b$ a fairly clean signal without significant crosstalk and ringing as occurred in FIG. $11_a$ (In both FIGS. $11_a$ and $11_b$, the ordinate of the grid has a calibration of 2 volts per centimeter while the abscissa is 100 nanoseconds per centimeter).

For example in FIG. $11_a$, looking at the upper portion of the signal on the photograph, there will be seen at centimeters 3 and 4 on the abscissa, a considerable amount of ringing. While comparing this on FIG. $11_b$ of the new transmission line there is seen much less ringing.

Further, in the old system of FIG. $11_a$, at the extreme right of the upper signal trace, there is seen a "stoop" or step which occurs; comparing this with the upper portion of FIG. $11_b$, at the right hand portion of the signal trace, there is seen a smooth rising transition without this "stoop".

Thus, there has been herein described a backplane transmission line system which interconnects a plurality of elements (on printed circuit boards) and termination impedances, making it possible to interconnect multitudes of electronic elements on PC boards to one another by means of control devices, such as open collector buffers and tri-state buffers, thus to control transmission line signals having rise and fall times in the 1 to 10 nanoseconds range with considerably less ringing, less signal degradation, less cross-talk, and less of the other undesirable and unwanted factors which might occur to the transmission line signal.

In view of the above described backplane transmission line system, the following claims are made:

1. An assembly comprising:
   a plurality of transmission lines made up of a plurality of etched microstrip traces on at least one outer insulating surface of a backplane, said backplane having at least a ground plane sandwiched between the outer insulating surfaces, and wherein
   at least some of said transmission lines are terminated at both ends thereof with their characteristic impedance,
   said impedance including a resistance-capacitance network.

2. The assembly of claim 1 wherein said transmission lines are connected to control devices for controlling the signals thereon and said control devices include buffers of the open-collector type, and said resistance-capacitance network, is coupled to a source of potential.

3. The assembly of claim 1 wherein said impedance includes a series resistance-capacitance network.

4. The assembly of claim 1 wherein said impedance includes a series capacitance-resistance network coupled between said transmission line and said ground plane.

5. The assembly of claim 1 wherein said impedance includes a series resistance-capacitance-resistance network coupled between a source of potential and said ground plane with said transmission line coupled to the junction of said capacitance with one of said resistances.

6. The assembly of claim 1 wherein said impedance includes a series resistance-capacitance network coupled between a source of potential and said ground plane.

7. The assembly of claim 1 wherein said transmission lines are connected to control devices for controlling the signals thereon and said control devices include buffers of the Transistor-Transistor Logic type.

8. The assembly of claim 7 wherein said control devices include buffers of the tri-state type.

9. A backplane comprising:
 a. backplane made of a voltage plane and a ground plane separated by an insulating layer, said voltage plane and said ground plane sandwiched between insulating layers which form a first face and a second face;
 b. terminals placed at specific locations on said backplane for electrically connecting points on said first and second faces and points on said voltage plane; and wherein;
 c. said first face mounts a plurality of connectors suitable for holding and mounting printed circuit boards;
 d. said first and second faces provide microstrip transmission lines which connect similarly located terminal pins on each of said connectors;
 e. each of said microstrip lines form a transmission line with the said ground plane or said voltage plane;
 f. each end of at least some of said transmission lines being terminated with their characteristic impedance and
 g. each said characteristic impedance including a series resistance-capacitance network.

10. The backplane of claim 9, including a plurality of printed circuit boards and means to control the signal on said transmission lines.

11. The backplane of claim 10 wherein said means to control includes buffers of at least the open-collector type.

12. The assembly of claim 11 wherein said resistance-capacitance network includes
 a first resistance,
 a second resistance, and
 a capacitance coupled between said first and said second resistances,
 said first resistance having its end remote from said capacitance coupled to said voltage plane,
 said second resistance having its end remote from said capacitance coupled to said group plane,
 said transmission line end coupled to the junction of said first resistance with said capacitance.

13. The assembly of claim 10 wherein said means to control includes buffers of at least the tri-state type.

14. The assembly of claim 13 wherein said resistance-capacitance network includes
 a capacitance, and
 a resistance connected in series with said capacitance,
 said series resistance-capacitance network coupled between the end of said transmission line and said ground plane.

15. A backplane having a first face and a second face comprising:
 a. a laminated structure composed of at least two layers of electrically conductive material and an intervening layer of insulating material; one of said layers forming a ground plane and the other layer a voltage supply plane;
 b. electrically conductive terminal pins mounted in columns upon said backplane and for connecting said first face of said backplane at selected points to said second face of said backplane, and also for contacting voltage supply points in said voltage plane;
 c. a plurality of connectors mounted upon said first face of said backplane for mounting and connecting printed circuit boards;
 d. microstrip conductive lines etched on at least said second face of said backplane, said microstrip lines connecting respective points on at least some of said connectors;
 e. terminating impedances coupled to each end of at least some of said microstrip transmission lines;
 f. said terminating impedances including a resistance-capacitance network.

16. The backplane of claim 15 further comprising
 an open collector-type buffer coupled to at least some of said transmission lines, and
 said terminating impedances include a series resistance-capacitance network coupled between said voltage plane and said ground plane.

17. The backplane of claim 15 further comprising
 a tri-state buffer coupled to at least some of said transmission lines, and
 said terminating impedances include a series resistor-capacitor coupled between said ground plane and said transmission lines having said tri-state buffer coupled thereto.

18. The backplane of claim 15 further comprising
 an open collector-type buffer coupled to at least some of said transmission lines, and
 said terminating impedances include a series resistor-capacitor-resistor divider connected between said voltage plane and said ground plane for said transmission lines having said open collector-type buffer coupled thereto.

19. In a system for interconnecting a multiplicity of terminals with means to control the voltage and signal condition on the interconnection means, the combination comprising:
 a backplane including:
  a. a plurality of connectors for supporting and connecting printed circuit boards;
  b. a plurality of microstrip transmission lines for connecting each respective terminal on one connector to respective terminals on at least some of the other connectors;
  c. means for terminating at least some of said microstrip transmission lines at both ends thereof to provide the characteristic impedance for each transmission line; and d. a plurality of printed circuit boards including control devices which connect to terminal points of at least some of said microstrip transmission lines wherein said control devices operate to control the potential on said microstrip transmission lines e. said characteristic impedance including a resistance-capacitance network coupled to each end of said transmission lines 20. The system of claim 19 wherein said backplane comprises:

a multilayer sandwich having at least a voltage plane, and a ground plane with all of said planes being separated by insulation.

21. In a printed circuit arrangement for pulse operation in the megahertz frequency range which arrangement involves circuit elements including buffers mounted on printed circuit boards and arranged to operate with respect to a common reference potential, and printed conductors connecting the elements together, the combination of:

a. a backplane including a ground plane;

b. microstrip lines etched on the surface of said backplane and forming a transmission line with said ground plane;

c. terminating impedances at each end of at least some of said microstrip lines to match the characteristic impedance and wherein said terminating impedances comprise a series resistor-capacitor network coupled between the transmission line and said ground plane with buffers of the tri-state type; and d. wherein said terminating impedances comprise a series resistor-capacitor network coupled between a source of potential and said ground plane with buffers of the open collector type.

* * * * *